United States Patent
Chen et al.

(10) Patent No.: US 12,088,906 B2
(45) Date of Patent: Sep. 10, 2024

(54) ELECTRONIC DEVICE CONVINIENT FOR REPLACEMENT OF CAMERA MODULE THEREOF

(71) Applicant: TRIPLE WIN TECHNOLOGY(SHENZHEN) CO.LTD., Shenzhen (CN)

(72) Inventors: Ye-Quang Chen, New Taipei (TW); Chia-Weng Hsu, New Taipei (TW); Wen-Ching Lai, New Taipei (TW); Wan-Li Zhang, Jinchen (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 257 days.

(21) Appl. No.: 17/577,776

(22) Filed: Jan. 18, 2022

(65) Prior Publication Data
US 2023/0171478 A1 Jun. 1, 2023

(30) Foreign Application Priority Data
Nov. 30, 2021 (CN) .......................... 202111443751.7

(51) Int. Cl.
*H04N 23/57* (2023.01)
*H04M 1/02* (2006.01)
*H05K 1/18* (2006.01)

(52) U.S. Cl.
CPC ............. *H04N 23/57* (2023.01); *H05K 1/183* (2013.01); *H04M 1/0264* (2013.01); *H05K 2201/10121* (2013.01)

(58) Field of Classification Search
CPC ................... H04N 23/57; H05K 1/183; H05K 2201/10121; H04M 1/0264; G06F 1/1607;
(Continued)

(56) References Cited

U.S. PATENT DOCUMENTS 6,628,244 B1* 9/2003 Hirosawa .............. G06F 1/1698
345/1.1
7,636,518 B2* 12/2009 Tanaka ................... G03B 17/14
396/56
(Continued)

OTHER PUBLICATIONS

"Shrapnel." Merriam-Webster.com Dictionary, Merriam-Webster, https://www.merriam-webster.com/dictionary/shrapnel. (Year: 2023).*

*Primary Examiner* — Jason A Flohre
(74) *Attorney, Agent, or Firm* — ScienBiziP, P.C.

(57) ABSTRACT

An electronic device includes a camera module comprising a circuit board, a lens, a first IC chip, and at least one metal column. The lens is mounted on the circuit board. The first IC chip and the metal column are arranged on a surface of the circuit board away from the lens. An attachment includes a body and a second IC chip. The first IC chip and the second IC chip can communicate with each other. The circuit board includes a first surface closed to the attachment. The metal column is arranged on the first surface, and the body includes a second surface close to the camera module. The body further includes at least a connecting channel. The metal column is located in the connecting channel to realize the electrical connection between the camera module and the attachment.

15 Claims, 4 Drawing Sheets

(58) Field of Classification Search
CPC ... G06F 1/1608; G06F 1/1609; G03B 17/565; G03B 17/566
See application file for complete search history.

(56) References Cited

U.S. PATENT DOCUMENTS

| | | | | |
|---|---|---|---|---|
| 9,813,629 | B2 * | 11/2017 | Lee | H04N 23/66 |
| 10,162,388 | B2 * | 12/2018 | Eremenko | H04W 88/02 |
| 2006/0233545 | A1 * | 10/2006 | Senba | H04N 23/66 |
| | | | | 396/529 |
| 2010/0208434 | A1 * | 8/2010 | Kim | H04N 23/631 |
| | | | | 361/729 |
| 2012/0262540 | A1 * | 10/2012 | Rondinelli | G03B 17/12 |
| | | | | 359/872 |
| 2013/0177304 | A1 * | 7/2013 | Chapman | G03B 17/565 |
| | | | | 396/533 |
| 2014/0160304 | A1 * | 6/2014 | Galor | H04N 23/66 |
| | | | | 348/207.1 |
| 2023/0012759 | A1 * | 1/2023 | Chiappe | H05K 1/141 |

\* cited by examiner

ELECTRONIC DEVICE CONVINIENT FOR REPLACEMENT OF CAMERA MODULE THEREOF

FIELD

The subject matter herein generally relates to an electronic device convenient for replacement of camera module thereof.

BACKGROUND

Electronic devices may have camera modules. An existing camera module may be mounted on a main board through a connector, and power and signals transmitted between the camera module and the main board through the connector. Heat generated by the connector may affect the signal transmission between the camera module and the main board and performance of the camera module.

BRIEF DESCRIPTION OF THE DRAWINGS

Implementations of the present disclosure will now be described, by way of embodiments, with reference to the attached figures.

DETAILED DESCRIPTION

Figure 1:
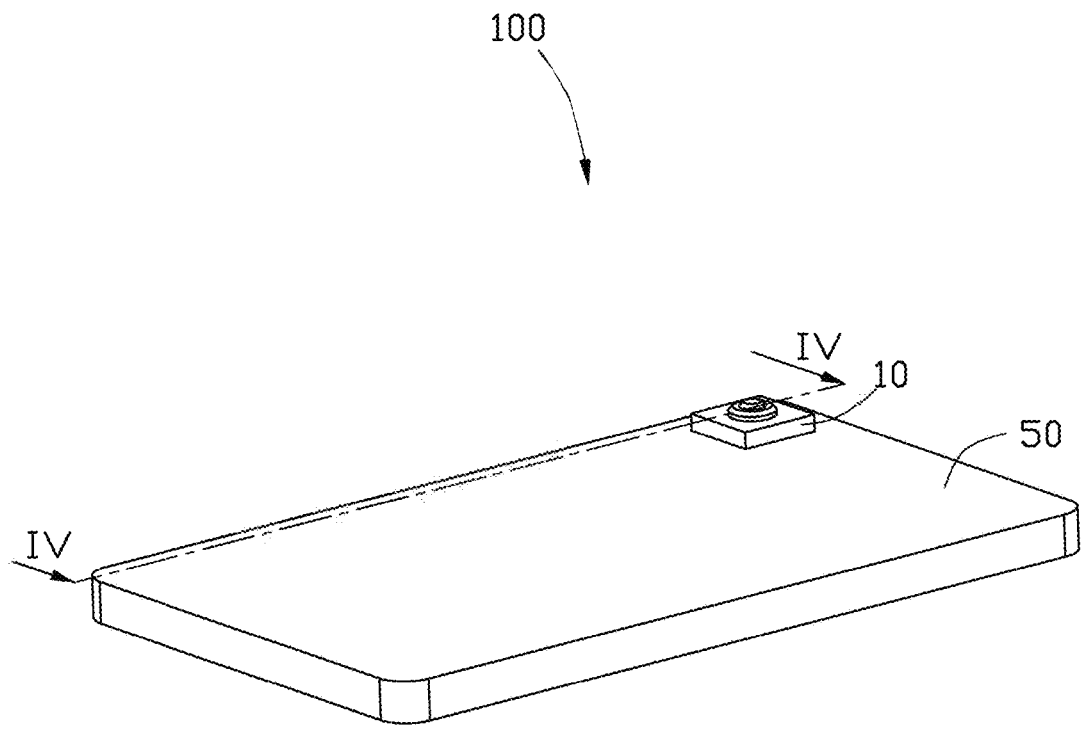
FIG. 1 is a diagrammatic view of an embodiment of an electronic device according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

FIG. 1 illustrates an embodiment of an electronic device 100. The electronic device 100 includes a camera module 10 and an attachment 50.

Figure 2:
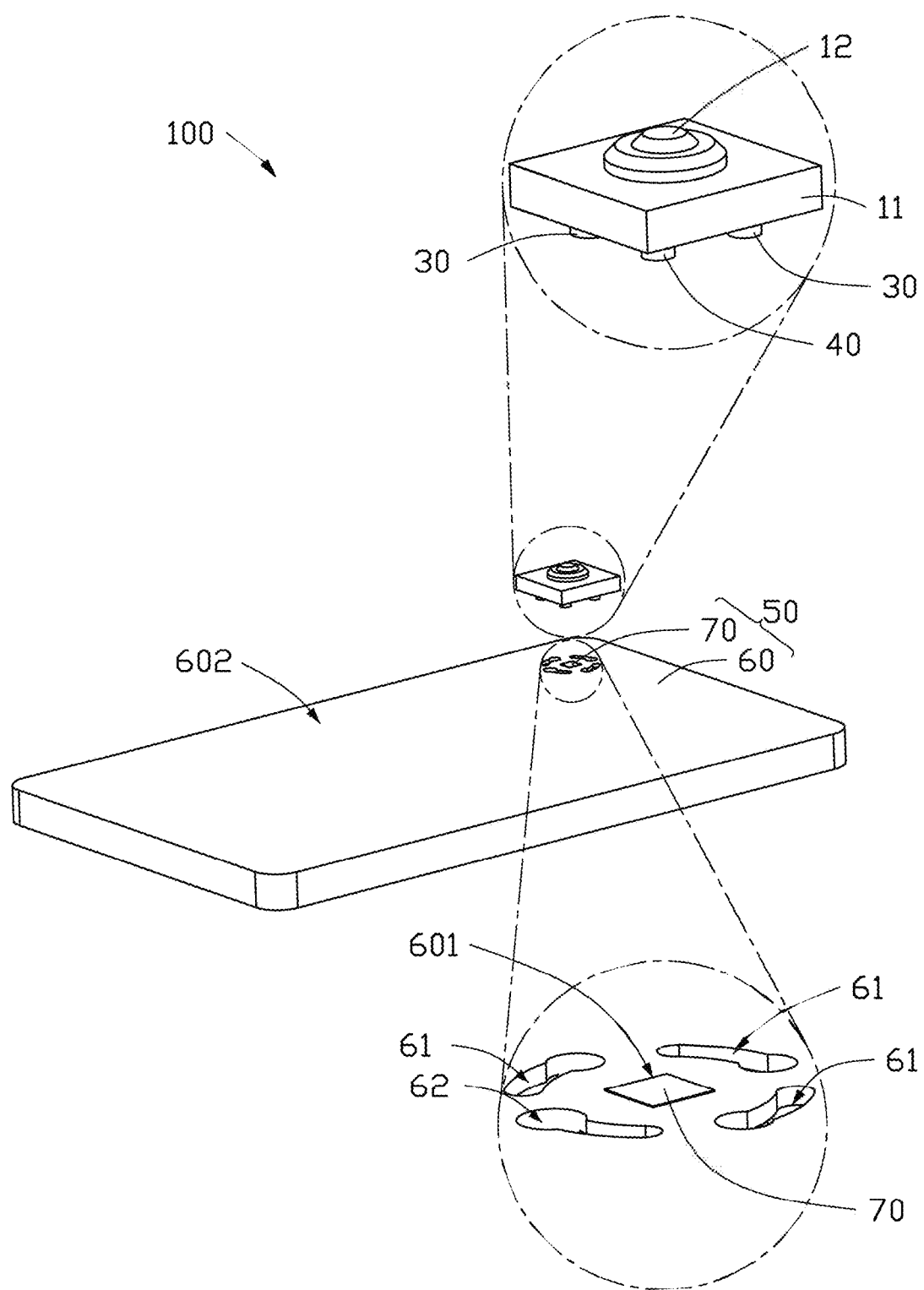
FIG. 2 is an exploded, diagrammatic view of the electronic device of FIG. 1.
Figure 3:
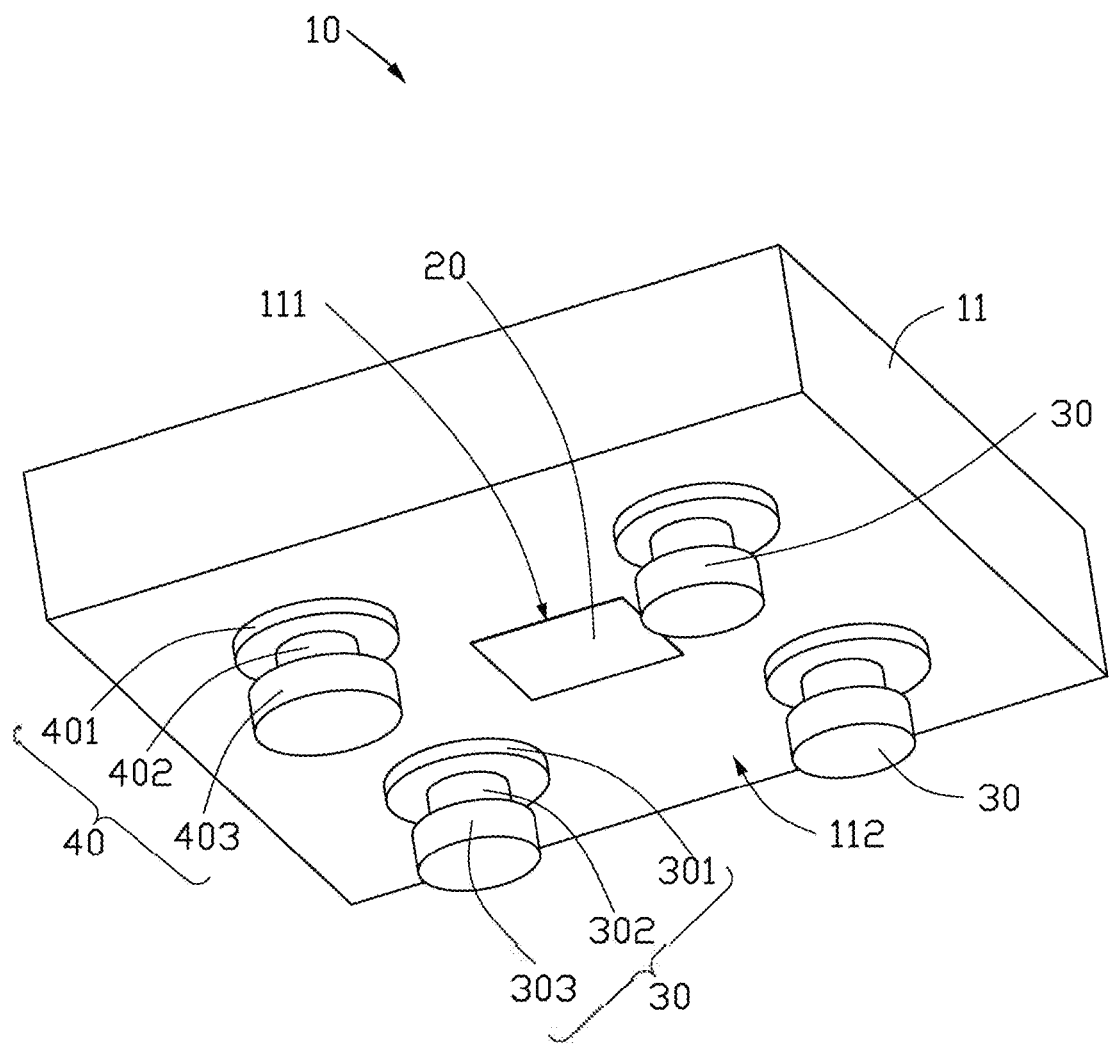
FIG. 3 is an exploded, diagrammatic view of a camera module in the electronic device of FIG. 1, from another angle.

Referring to FIGS. 2 and 3, in at least one embodiment, the camera module 10 includes a circuit board 11, a lens 12, a first IC chip 20, at least one metal column 30, and a fool-proofing column 40.

In at least one embodiment, the circuit board 11 may be a flexible circuit board, a rigid circuit board, or a rigid-flexible circuit board. In an embodiment, the circuit board 11 is a rigid circuit board. The circuit board 11 includes a first receiving groove 111. The circuit board 11 further includes a first surface 112 close to the attachment 50, and a portion of the first surface 112 is recessed inwardly to form the first receiving groove 111. In at least one embodiment, the first receiving groove 111 may be rectangular.

The lens 12 is mounted on the circuit board 11. The lens 12 and the first receiving groove 111 are located on opposite surfaces of the circuit board 11.

The first IC chip 20 is received in the first receiving groove 111. The first IC chip 20 is electrically connected with the circuit board 11. Signals on the circuit board 11 can be transmitted to the first IC chip 20. The first IC chip 20 can process the signals. In addition, the first IC chip 20 can also process received signals to and from the circuit board 11.

Referring to FIG. 3, in at least one embodiment, the number of metal columns 30 is three. The metal column 30 is roughly I-shaped. In at least one embodiment, the metal column 30 includes a first fitting section 301, a first connecting section 302, and a first fixing section 303 connected in that order. The diameter of the first connecting section 302 is smaller than the diameter of the first fitting section 301 and of the diameter of the first fixing section 303. The first fitting section 301 is located on the first surface 112. In at least one embodiment, the metal column 30 is made of copper.

In at least one embodiment, the number of fool-proofing columns 40 is one. The fool-proofing column 40 is roughly I-shaped. In at least one embodiment, the fool-proofing column 40 includes a second fitting section 401, a second connecting section 402, and a second fixing section 403 connected in that order. The diameter of the second connecting section 402 is smaller than the diameter of the second fitting section 401 and the diameter of the second fixing section 403. The second fitting section 401 is located on the first surface 112. In at least one embodiment, the fool-proofing column 40 is made of copper. The size of the fool-proofing column 40 is not equal to the size of the metal column 30 for ensuring installation in the correct orientation. That is, the size of the fool-proofing column 40 can be larger than or smaller than the size of the metal column 30.

In at least one embodiment, the three metal columns 30 and the fool-proofing column 40 are arranged around the first IC chip 20. The three metal columns 30 and the fool-proofing column 40 are roughly positioned at four corners of a rectangle.

In at least one embodiment, the camera module 10 may also include other devices, such as an optical filter and a photosensitive chip.

Referring to FIG. 2, in at least one embodiment, the attachment 50 includes a body 60 and a second IC chip 70. The body 60 may be rectangular. In at least one embodiment, the attachment 50 may be a motherboard.

The body 60 includes a second receiving groove 601. The body 60 further includes a second surface 602 close to the circuit board 11, and a portion of the second surface 602 is recessed inwardly to form the second receiving groove 601. The second receiving groove 601 faces the first receiving groove 111. In at least one embodiment, the second receiving groove 601 may be rectangular.

The second IC chip 70 is received in the second receiving groove 601. The second IC chip 70 faces the first IC chip 20, since the second receiving groove 601 faces the first receiving groove 111.

The second IC chip 70 is electrically connected with the body 60. Signals of the body 60 can be transmitted to the second IC chip 70. The second IC chip 70 can process signals. In addition, the second IC chip 70 can also process received signals to and from the body 60.

The first IC chip 20 and the second IC chip 70 can communicate with each other to realize data transmission between the circuit board 11 and the body 60, so as to realize the signals transmission between the camera module 10 and the attachment 50.

Figure 4:
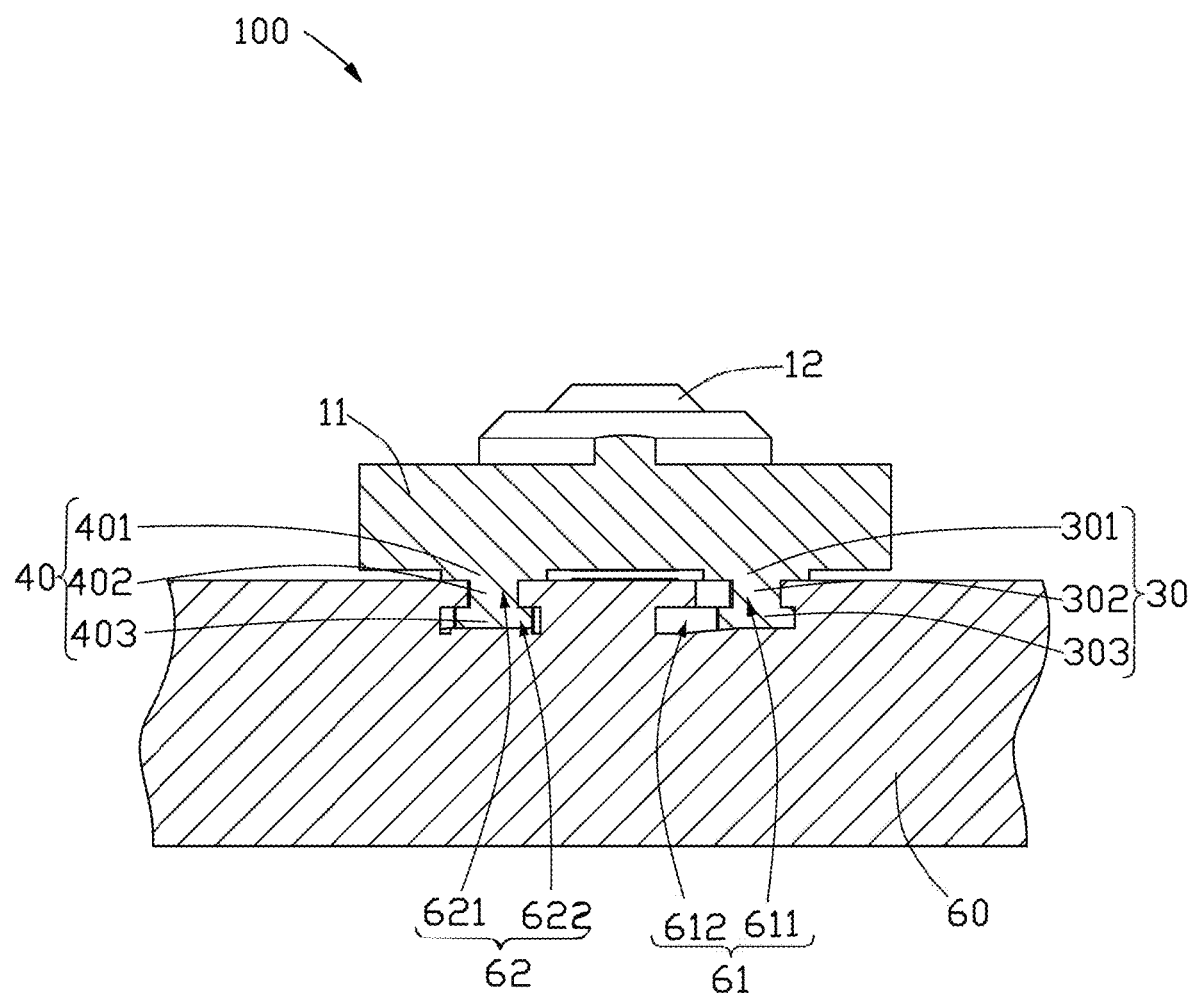
FIG. 4 is a cross-sectional view taken along IV-IV line of FIG. 1.

Referring to FIG. 4, the body 60 further includes at least a connecting channel 61. A portion of the second surface 602 is recessed inwardly to form the connecting channel 61. Along the thickness direction of the body 60, the connecting channel 61 includes a first connecting channel section 611 and a second connecting channel section 612 connected to the first connecting channel section 611. The inner diameter of the first connecting channel section 611 is smaller than the inner diameter of the second connecting channel section 612, and the diameter of the first fixing section 303 is larger than the inner diameter of the first connecting channel section 611. In at least one embodiment, the first fitting section 301 is located outside the connecting channel 61, the first connecting section 302 is located in the first connecting channel section 611, and the first fixing section 303 is located in the second connecting channel section 612, so that the camera module 10 is arranged on the attachment 50. In at least one embodiment, the bottom surface of the second connecting channel section 612 is provided with a shrapnel (not shown). Thus, when the metal column 30 rotates in the connecting channel 61, the second connecting channel section 612 gradually presses the first fixing section 303. Thus, the stability of the camera module 10 on the attachment 50 can be improved. In at least one embodiment, the number of connecting channels 61 is three.

The body 60 further includes a fool-proofing channel 62. A portion of the second surface 602 is recessed inwardly to form the fool-proofing channel 62. Along the thickness direction of the body 60, the fool-proofing channel 62 includes a first fool-proofing channel section 621 and a second fool-proofing channel section 622 connected to the first fool-proofing channel section 621. The inner diameter of the first fool-proofing channel section 621 is smaller than the inner diameter of the second fool-proofing channel section 622, and the diameter of the second fixing section 403 is larger than the inner diameter of the first fool-proofing channel section 621. In at least one embodiment, the second fitting section 401 is located outside the fool-proofing channel 62, the second connecting section 402 is located in the first fool-proofing channel section 621, and the second fixing section 403 is located in the second fool-proofing channel section 622. In at least one embodiment, the number of fool-proofing channels 62 is one.

In at least one embodiment, the three connecting channels 61 and the fool-proofing channel 62 are arranged around the second IC chip 70. The three connecting channels 61 and the fool-proofing channel 62 are roughly disposed at four corners of a rectangle.

In the present disclosure, power transmission is separated from the signal transmission between the camera module 10 and the attachment 50. Namely, power transmission between the camera module 10 and the attachment 50 is realized through the metal column 30, and the signal transmission between the camera module 10 and the attachment 50 is realized through the first IC chip 20 and the second IC chip 70. Thus, heat conduction and heat radiation between the camera module 10 and the attachment 50 is reduced, which can reduce the effect of the heat on the signal transmission.

In addition, as the camera module 10 and the attachment 50 are connected through the metal column 30, the camera module 10 on the attachment 50 can be replaced at any time. Namely, the camera module 10 of the electronic device 100 can be replaced at any time.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. An electronic device, comprising:
a camera module comprising a circuit board, a lens, a first IC chip, and at least one metal column, wherein the lens is mounted on the circuit board, and the first IC chip and the metal column are arranged on a surface of the circuit board away from the lens; and
a attachment comprising a body and a second IC chip, wherein the first IC chip and the second IC chip are configured to communicate with each other to realize information transmission, and the circuit board comprises a first surface close to the attachment, the metal column is arranged on the first surface, and the body comprises a second surface close to the camera module, the body further comprises at least a connecting channel, a portion of the second surface is recessed inwardly to form the connecting channel, and the metal column is located in the connecting channel to realize electrical connection between the camera module and the attachment.

2. The electronic device of claim 1, wherein the metal column comprises a first fitting section, a first connecting section, and a first fixing section connected in that order, along a thickness direction of the body, the connecting channel comprises a first connecting channel section and a second connecting channel section connected to the first connecting channel section, the first fitting section is located outside the connecting channel, the first connecting section is located in the first connecting channel section, and the first fixing section is located in the second connecting channel section.

3. The electronic device of claim 2, wherein a diameter of the first connecting section is smaller than a diameter of the first fitting section and a diameter of the first fixing section, an inner diameter of the first connecting channel section is smaller than an inner diameter of the second connecting channel section, and the diameter of the first fixing section is larger than the inner diameter of the first connecting channel section.

4. The electronic device of claim 1, wherein the circuit board further comprises a first receiving groove, and a portion of the first surface is recessed inwardly to form the first receiving groove, the first IC chip is received in the first receiving groove, the body further comprises a second receiving groove, and a portion of the second surface is recessed inwardly to form the second receiving groove, and the second IC chip is received in the second receiving groove.

5. The electronic device of claim 4, wherein the first receiving groove faces the second receiving groove.

6. The electronic device of claim 5, wherein the first IC chip faces the second IC chip.

7. The electronic device of claim 1, wherein the metal column is made of copper.

8. The electronic device of claim 1, wherein the camera module further comprises a fool-proofing column, the fool-proofing column is arranged on the first surface, and the body further comprises a fool-proofing channel, a portion of the second surface is recessed inwardly to form the fool-proofing channel, and the fool-proofing column is located in the fool-proofing channel.

9. The electronic device of claim 8, wherein the at least a connecting channel comprises three connecting channels, the three connecting channel and the fool-proofing channel are arranged around the second IC chip, the three connecting channel and the fool-proofing channel are disposed at four corners of an imaginary rectangle.

10. The electronic device of claim 8, wherein the fool-proofing column comprises a second fitting section, a second connecting section and a second fixing section connected in that order, along a thickness direction of the body, the fool-proofing channel comprises a first fool-proofing channel section and a second fool-proofing channel section connected to the first fool-proofing channel section, the second fitting section is located outside the fool-proofing channel, the second connecting section is located in the first fool-proofing channel section, and the second fixing section is located in the second fool-proofing channel section.

11. The electronic device of claim 10, wherein a diameter of the second connecting section is smaller than a diameter of the second fitting section and a diameter of the second fixing section, an inner diameter of the first fool-proofing channel section is smaller than an inner diameter of the second fool-proofing channel section, and a diameter of the second fixing section is larger than an inner diameter of the first fool-proofing channel section.

12. The electronic device of claim 8, wherein a size of the fool-proofing column is larger than or smaller than a size of the metal column.

13. The electronic device of claim 8, wherein the at least a metal column comprises three metal columns, the three metal columns and the fool-proofing column are arranged around the first IC chip, the three metal columns and the one fool-proofing column are disposed at four corners of an imaginary rectangle.

14. The electronic device of claim 8, wherein the fool-proofing column is made of copper.

15. The electronic device of claim 1, wherein the attachment is a motherboard.

* * * * *